US007884886B2

(12) United States Patent
Belk

(10) Patent No.: US 7,884,886 B2
(45) Date of Patent: Feb. 8, 2011

(54) INTEGRATED CHANNEL FILTER AND METHOD OF OPERATION

(75) Inventor: Nathan R. Belk, Lucas, TX (US)

(73) Assignee: Zoran Corporation, Sunnyvale, CA (US)

( * ) Notice: Subject to any disclaimer, the term of this patent is extended or adjusted under 35 U.S.C. 154(b) by 1299 days.

(21) Appl. No.: 10/694,074

(22) Filed: Oct. 27, 2003

(65) Prior Publication Data

US 2005/0088254 A1 Apr. 28, 2005

(51) Int. Cl.
*H04N 5/44506* (2006.01)
*H03J 3/00* (2006.01)

(52) U.S. Cl. ....................... 348/731; 348/725; 348/735; 348/737; 334/18; 455/182.3; 455/307; 455/311; 455/333

(58) Field of Classification Search ......... 348/731–733, 348/725, 735, 737; 334/18; 333/174; 455/182, 455/3, 307, 311, 333
See application file for complete search history.

(56) References Cited

U.S. PATENT DOCUMENTS 3,800,240 A 3/1974 Zelenz ........................ 330/52
4,216,451 A 8/1980 Nishimura et al. ............ 334/15
4,480,338 A * 10/1984 Dobrovolny ............. 455/188.1
5,737,035 A * 4/1998 Rotzoll ....................... 348/725
5,825,833 A * 10/1998 Sakaue ........................ 375/344
5,898,900 A * 4/1999 Richter et al. ................. 725/70
5,930,696 A 7/1999 Tzuang et al. .............. 455/311
6,118,499 A * 9/2000 Fang .......................... 348/726
6,177,964 B1 1/2001 Birleson et al. ............. 348/725
6,297,858 B1 * 10/2001 Yang .......................... 348/731
6,313,885 B1 * 11/2001 Patel et al. .................. 348/725
6,681,103 B1 1/2004 Rogers et al. ............... 455/302
6,831,497 B2 12/2004 Koh et al. ................... 327/254
6,882,245 B2 4/2005 Utsunomiya et al. ........ 333/174
6,909,470 B2 * 6/2005 Mizukami et al. ........... 348/726
6,925,291 B2 8/2005 Pugel ...................... 455/191.1
6,931,083 B1 * 8/2005 Linder et al. ................ 375/345
7,006,162 B2 * 2/2006 Cowley et al. .............. 348/731
7,173,505 B2 2/2007 Behzad ........................ 334/56
7,187,913 B1 * 3/2007 Rahn et al. ............... 455/188.1
7,196,737 B1 * 3/2007 Fulga et al. ................. 348/730
7,212,586 B2 5/2007 Shi et al. .................... 375/316

(Continued)

FOREIGN PATENT DOCUMENTS

EP 1 282 227 A2 2/2003

(Continued)

OTHER PUBLICATIONS

European Patent Office Communication pursuant to Article 96(2) EPC; 6 pages, Dec. 27, 2006.

(Continued)

*Primary Examiner*—Brian Yenke
(74) *Attorney, Agent, or Firm*—Fulbright & Jaworski L.L.P.

(57) ABSTRACT

A system includes a filter and a tuner formed on an integrated circuit. The filter receives an input signal comprising a first number of channels and communicates an intermediate output signal comprising a second number of channels less than the first number of channels. The tuner is coupled to the filter and receives the intermediate output signal and communicates an output signal comprising a third number of channels less than the second number of channels.

12 Claims, 4 Drawing Sheets

U.S. PATENT DOCUMENTS

| | | | | |
|---|---|---|---|---|
| 7,304,533 | B2 | 12/2007 | Hisayasu et al. | 327/553 |
| 2003/0032398 | A1* | 2/2003 | Harris | 455/147 |
| 2005/0024544 | A1* | 2/2005 | Waight et al. | 348/731 |
| 2005/0096004 | A1* | 5/2005 | Tso et al. | 455/334 |

FOREIGN PATENT DOCUMENTS

| | | | |
|---|---|---|---|
| EP | 1 345 324 | A2 | 9/2003 |
| JP | 359100613 | A | 6/1984 |

OTHER PUBLICATIONS

PCT Search Report for PCT/US2004/032853, 12 pages, Jan. 24, 2005.

Patent Pending U.S. Appl. No. 11/999,504 by Philip T. Hisayasu, et al., entitled *Integrated Channel Filter Using Multiple Resonant Filters and Method of Operation*; 20 total pages, filed Dec. 4, 2007.

Patent Pending U.S. Appl. No. 11/107,167 by Philip T. Hisayasu, et al., entitled *An Integrated Channel Filter Using Multiple Resonant Filters and Method of Operation*, 20 total pages, filed Apr. 15, 2005.

PCT Notification of Transmittal of the International Search Report and the Written Opinion of the International Searching Authority for International Application No. PCT/US06/14349, 9 pages, Aug. 7, 2006.

* cited by examiner

70

| | 72 | STAGE 40a | | | STAGE 40b | | | | STAGE 40c | | |
|---|---|---|---|---|---|---|---|---|---|---|---|
| | | 74a | 74b | 74c | 76a | 76b | 76c | 76d | 78a | 78b | 78c |
| | CENTER FREQUENCY (MHz) | CAPACITOR 62a | CAPACITOR 62b | CAPACITOR 62c | CAPACITOR 62d | CAPACITOR 62e | CAPACITOR 62f | CAPACITOR 62g | CAPACITOR 62h | CAPACITOR 62i | CAPACITOR 62j |
| 80 | 0 | SHORTED | SHORTED | SHORTED | | | | | | | |
| 82 | 136 | ENABLED | | | | | | | | | |
| 84 | 221 | ENABLED | ENABLED | | | | | | | | |
| 86 | 306 | ENABLED | ENABLED | ENABLED | | | | | | | |
| 88 | 392 | | | | ENABLED | | | | | | |
| 90 | 460 | | | | ENABLED | ENABLED | | | | | |
| 92 | 542 | | | | ENABLED | ENABLED | ENABLED | | | | |
| 94 | 620 | | | | ENABLED | ENABLED | ENABLED | ENABLED | | | |
| 96 | 696 | | | | | | | | ENABLED | | |
| 98 | 772 | | | | | | | | ENABLED | ENABLED | |
| 100 | 848 | | | | | | | | ENABLED | ENABLED | ENABLED |

*FIG. 4*

INTEGRATED CHANNEL FILTER AND METHOD OF OPERATION

TECHNICAL FIELD OF THE INVENTION

This invention relates in general to signal processing, and more particularly to an integrated channel filter.

BACKGROUND OF THE INVENTION

The power and performance requirements for a broadband tuner are determined by the number of channels that the tuner processes. A typical broadband tuner receives and processes over one-hundred channels in order to yield the one or more channels that are desired. This results in a number of disadvantages. For example, the number of intermodulation products produced by the tuner grows as the square of the number of channels that are processed by the tuner. A tuner that processes over one-hundred channels therefore experiences significant noise. Moreover, the intermodulation products produced by a tuner that processes over one-hundred channels decreases the range of gain programmability of the tuner.

SUMMARY OF THE INVENTION

In accordance with the present invention, the disadvantages and problems associated with prior tuners have been substantially reduced or eliminated.

In accordance with one embodiment of the present invention, a system includes a filter and a tuner formed on an integrated circuit. The filter receives an input signal comprising a first number of channels and communicates an intermediate output signal comprising a second number of channels less than the first number of channels. The tuner is coupled to the filter and receives the intermediate output signal and communicates an output signal comprising a third number of channels less than the second number of channels.

Another embodiment of the present invention is a filter for receiving an input signal comprising a first number of channels and for communicating an intermediate output signal comprising a second number of channels less than the first number of channels. The filter comprises at least one stage that comprises an inductor, a first capacitor, and a plurality of switchable capacitors. The first capacitor has a first lead and a second lead, wherein the first lead of the first capacitor is coupled to a lead of the inductor. Each of the switchable capacitors has a first lead coupled to the first lead of the first capacitor and a second lead switchably coupled to the second lead of the first capacitor.

Yet another embodiment of the present invention is a method for filtering an input signal. The method includes receiving an input signal comprising a plurality of bands of channels. The method continues by switching among a plurality of stages of a filter to communicate an intermediate output signal comprising a selected one of the plurality of bands of channels. The filter is formed on an integrated circuit. The method concludes by receiving the intermediate output signal and communicating an output signal comprising a subset of the channels from the selected band of channels.

The following technical advantages may be achieved by some, none, or all of the embodiments of the present invention.

Particular technical advantages of the present invention are achieved because the filter is formed at least in part on the integrated circuit. For example, filters that are not formed on the integrated circuit propagate the desired channels but reflect the undesired channels back to the transmitter or other source of the input signal. This reflection of undesired channels tends to corrupt all of the channels in the input signal, including the desired channels. The filter which is formed on the integrated circuit communicates the desired channels but does not reflect the undesired channels back to the transmitter or source of the input signal. Instead, the undesired channels are dissipated in various components, such as the lossy elements, of the integrated circuit. The corruption of the desired channels is therefore no longer a significant issue.

By arranging the filter before or integral to an input stage of the tuner, the circuit of the present invention achieves particular technical advantages. For example, as described above, the number of intermodulation products produced by the tuner grows as the square of the number of channels that are processed by the tuner. Therefore, by attenuating approximately 80% of the undesired channels prior to the processing performed by the tuner, the circuit eliminates roughly 95% of the intermodulation products produced by the tuner. The range of gain programmability of the tuner is therefore increased. The reduction in intermodulation products also tends to reduce many second order intermodulation products (e.g., second order harmonic distortion). Furthermore, as described above, the power and performance requirements for the tuner are determined by the number of channels processed by the tuner. By reducing the number of channels processed by the tuner (e.g., from one-hundred-thirty-three channels to twenty-five channels in a television system), the power consumption in subsequent stages of the tuner is reduced.

These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which:

FIG. 4 illustrates mapping information used to operate the filter depicted in FIG. 1;

DETAILED DESCRIPTION OF THE INVENTION

Figure 1:
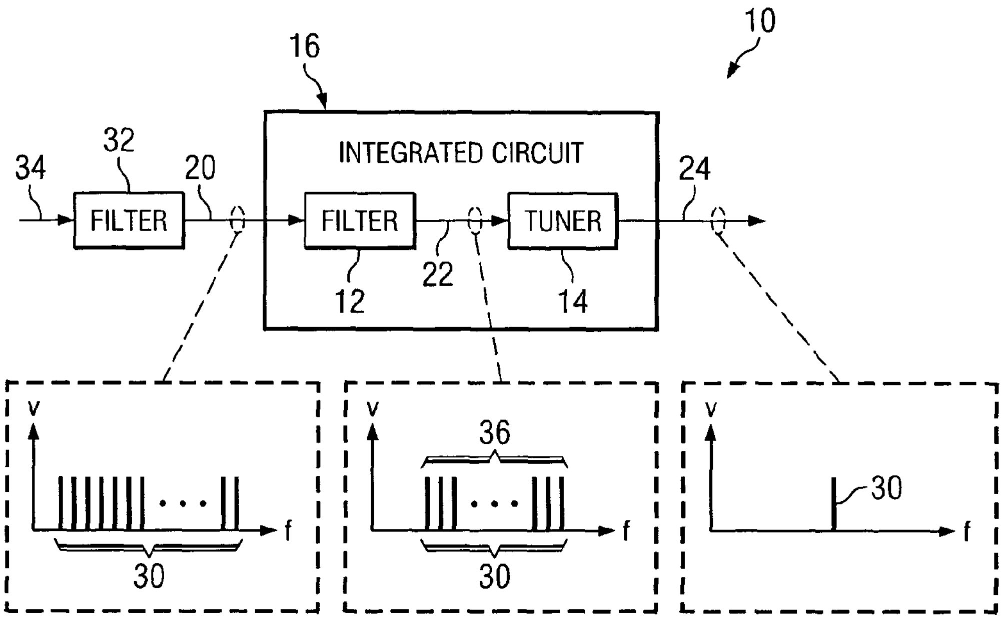
FIG. 1 illustrates one embodiment of a system that includes a filter and a tuner formed on an integrated circuit.

FIG. 1 illustrates one embodiment of a system 10 that includes a filter 12 coupled to a tuner 14. At least portions of filter 12 and tuner 14 are formed on an integrated circuit 16. In a particular embodiment associated with television systems, system 10 further comprises a front-end filter 32. In general, filter 12 receives an input signal 20 comprising a first number of channels 30. Filter 12 communicates an intermediate output signal 22 comprising a second number of channels 30 less than the first number of channels 30. Tuner 14 receives intermediate output signal 22 and communicates an output signal 24 comprising a third number of channels 30 less than the second number of channels 30. In this respect, the number of channels 30 received and processed by tuner 14 is reduced over prior techniques for performing tuning of channels 30.

Filter 12 comprises any suitable number and combination of frequency selective components that may be formed on integrated circuit 16. In a particular embodiment described in greater detail with reference to FIG. 2, filter 12 comprises a plurality of filter stages and is switchable among the plurality of stages in order to communicate an intermediate output signal 22 that comprises a selected band of channels 30. At least one of the stages of filter 12 comprises an inductor and a parallel combination of capacitors arranged in series with the inductor. At least a portion of the capacitors may be switched into or out of connection with the inductor to change the frequency selectivity of the filter 12. These and other aspects of filter 12 are explained in greater detail with reference to FIG. 2.

Particular technical advantages of system 10 are achieved because filter 12 is formed at least in part on integrated circuit 16. For example, filters that are not formed on the integrated circuit 16 propagate the desired channels 30 but reflect the undesired channels 30 back to the transmitter or other source of the input signal 20. This reflection of undesired channels 30 tends to corrupt all of the channels 30 in the input signal 20, including the desired channels 30. Filter 12 formed on integrated circuit 16 communicates desired channels 30 but does not reflect the undesired channels 30 back to the transmitter or source of input signal 20. Instead, the undesired channels 30 are dissipated in various components, such as the lossy elements, of integrated circuit 16. The corruption of the desired channels 30 is therefore no longer a significant issue. Moreover, an advantage of system 10 is that no transistor on integrated circuit 16 is required to provide a voltage gain or otherwise amplify the entire frequency spectrum of input signal 20.

Tuner 14 comprises any suitable number and combination of active and passive components including, but not limited to, variable low noise amplifiers, gain control modules, mixers, and filters that may extract content from a desired radio frequency spectrum and convert the content into a form that is useable, for example, by an access device. In one embodiment, tuner 14 comprises a television tuner for use in a television system. Although filter 12 and tuner 14 are illustrated as separate components in FIG. 1, it should be understood that in particular embodiments filter 12 may be formed integral to tuner 14. For example, filter 12 may be formed integral to an input stage of tuner 14. By arranging filter 12 before or integral to an input stage of tuner 14, system 10 achieves particular technical advantages.

For example, as described above, the number of intermodulation products produced by the tuner 14 grows as the square of the number of channels 30 that are processed by the tuner 14. Therefore, by attenuating approximately 80% of the undesired channels 30 prior to the processing performed by tuner 14, circuit 10 eliminates roughly 95% of the intermodulation products produced by tuner 14. The range of gain programmability of tuner 14 is therefore increased. The reduction in intermodulation products also tends to reduce many second order intermodulation products (e.g., second order harmonic distortion). Furthermore, as described above, the power and performance requirements for tuner 14 are determined by the number of channels 30 processed by tuner 14. By reducing the number of channels 30 processed by tuner 14 (e.g., from one-hundred-thirty-three channels to twenty-five channels in a television system), the power consumption in subsequent stages of tuner 14 is reduced.

Input signal 20 comprises a radio frequency signal. In a television system, signals representing individual channels 30 are assigned to specific frequencies in a defined frequency band. For example, in the United States, television signals are generally transmitted in a band from 48 MHz to 852 MHz. In such television systems, front-end filter 32 comprises a low-pass filter that receives a signal 34 and is designed to significantly attenuate all frequencies above an input cutoff frequency that is higher than the frequencies of the channels 30 in the television band. The output of front-end filter 32 is therefore input signal 20 having channels 30 in the television band.

Intermediate output signal 22 comprises a particular band 36 of channels 30 selectively communicated by filter 12. Therefore, when used in a television system, at least some of the channels 30 in the television frequency band are significantly attenuated in input signal 20 to form intermediate output signal 22. For example, input signal 20 includes one-hundred-thirty-three channels 30 and intermediate output signal 22 includes approximately twenty-five channels 30. Output signal 24 comprises, for example, one or more desired channels 30 from intermediate output signal 22. In a television system, for example, output signal 24 may comprise a single desired channel 30 in the television band.

In operation, filter 12 receives an input signal 20 comprising a first number of channels 30. Filter 12 is switched among a plurality of stages and/or capacitors of a particular stage in order to communicate an intermediate output signal 22 comprising a selected one or more of the plurality of bands of channels 30. The selected one or more of the plurality of bands of channels 30 comprises a second number of channels 30 less than the first number of channels 30. Filter 12 dissipates undesired channels 30 in lossy elements of integrated circuit 16. Tuner 14 receives intermediate output signal 22 and communicates an output signal 24 comprising a third number of channels 30 less than the second number of channels 30. In particular embodiments, the output signal 24 comprises a single channel 30 in the television band.

Figure 2:
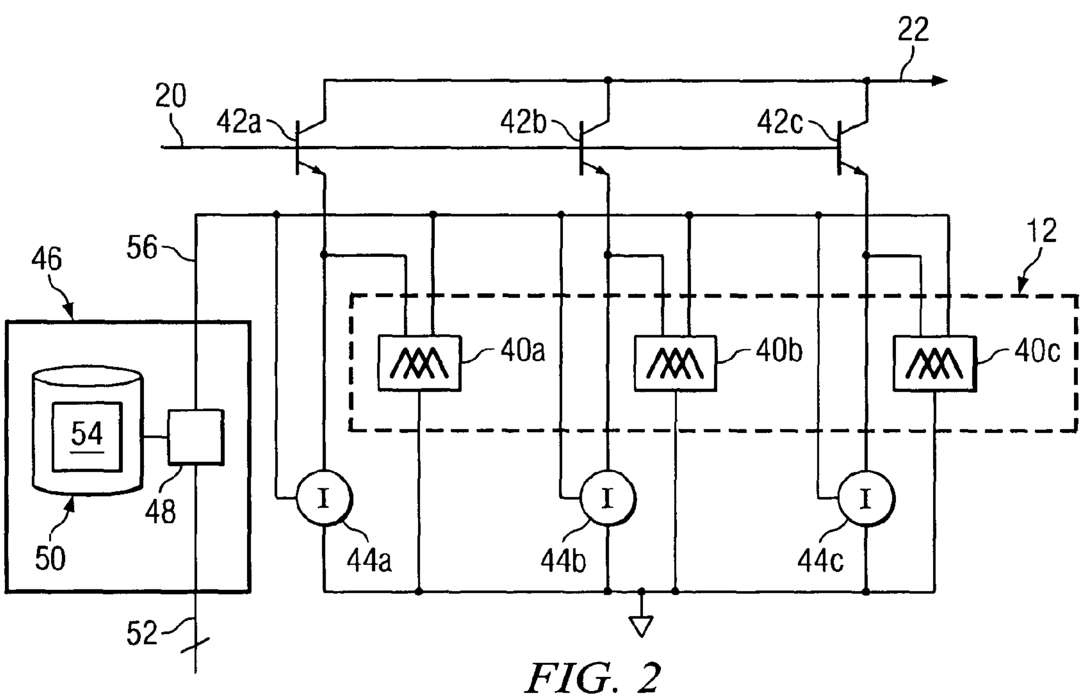
FIG. 2 illustrates one embodiment of the filter depicted in FIG. 1.

FIG. 2 illustrates a particular embodiment of circuit 10 in which filter 12 is integrated with an input stage of tuner 14 on integrated circuit 16. In this embodiment, filter 12 comprises a plurality of filter stages 40*a*, 40*b*, and 40*c*. Stages 40*a*, 40*b*, and 40*c* are collectively referred to as stages 40 and generally referred to as a stage 40. Each stage 40 is associated with a particular range of frequency selection. For example, stage 40*a* may be associated with frequency selection ranging from 48 MHz to 348 MHz. Stage 40*b* may be associated with frequency selection ranging from 348 MHz to 658 MHz. Stage 40*c* may be associated with frequency selection ranging from 658 MHz to 848 MHz. The frequency ranges are examples only and stages 40*a-c* may be associated with other frequency ranges as needed or desired for particular implementations.

Although FIG. 2 illustrates filter 12 having three stages 40, it should be understood that filter 12 may be implemented using any suitable number of stages 40 to derive a desired level of granularity associated with the ranges of frequency selection. Each stage 40, as described in greater detail with reference to FIGS. 3A-3C, comprises a network of capacitors having particular values and switchably coupled to an inductor such that the range of frequency selection associated with that stage 40 may be implemented using different center frequencies.

Each stage 40 is coupled to a corresponding transistor 42. In particular, stage 40*a* is coupled to transistor 42*a*; stage 40*b* is coupled to transistor 42*b*; and stage 40*c* is coupled to transistor 42*c*. Transistors 42*a*, 42*b*, and 42*c* are collectively referred to as transistors 42 and generally referred to as a transistor 42. Transistors 42 may form a part of tuner 14, such as a part of the input stage of tuner 14. Each transistor 42 comprises a three terminal device. As illustrated, each transistor 42 comprises an NPN transistor having a base terminal receiving input signal 20, an emitter terminal coupled to a corresponding current source 44, and a collector terminal communicating intermediate output voltage 22. Therefore, the emitter terminal of transistor 42*a* is coupled to input source 44*a*; the emitter terminal of transistor 42*b* is coupled to input source 44*b*; and the emitter terminal of transistor 42*c* is coupled to input source 44*c*. Other types of transistors may be used without departing from the scope of the invention. Input sources 44*a*, 44*b*, and 44*c* are collectively referred to as input sources 44 and generally referred to as an input source 44. Each stage 40 and corresponding input source 44 is coupled to controller 46. Controller 46 may be implemented in hardware, software, firmware, or any combination thereof, and comprises a processor 48 coupled to a memory 50.

Although FIG. 2 depicts filter 12 and associated components using a single-ended implementation, it may be desirable to implement a differential architecture of filter 12 and associated components to yield a differential signal for intermediate output signal 22. A differential embodiment of filter 12 is illustrated, for example, in FIG. 5.

In operation, each of transistors 42 receives input signal 20 including all constituent channels 30 (e.g. one-hundred-thirty-three channels 30 in a television system). Depending upon which of transistors 42 are turned on using current sources 44, one of the three stages 40 is enabled. Based upon the particular stage 40 that is enabled, a particular range of frequency selection is performed upon input signal 20 to produce intermediate output signal 22. Controller 46 controls which of stages 40 is enabled and which of the capacitors associated with that stage 40 are enabled. In particular, controller 46 receives a channel selection signal 52 identifying a particular channel 30 or subset of channels 30 that are desired. Controller 46 may receive signal 52 from other components of system 10 such as, for example, components of tuner 14. Controller 46 refers to mapping information 54 stored within memory 50 using the information communicated in channel selection signal 52. Mapping information 54, described in greater detail with reference to FIG. 4, associates particular stages 40 and a particular configuration of capacitors within stages 40 with a particular range of frequency containing the desired channel 30 or channels 30. Based upon mapping information 54, controller 46 communicates a command signal 56 to enable a selected stage 40 and a particular configuration of capacitors within the selected stage 40 to implement a particular frequency selection upon input signal 20. As a result, the intermediate output signal 22 contains a fewer number of channels 30 than the original input signal 20 received by filter 12.

Figure 3A:
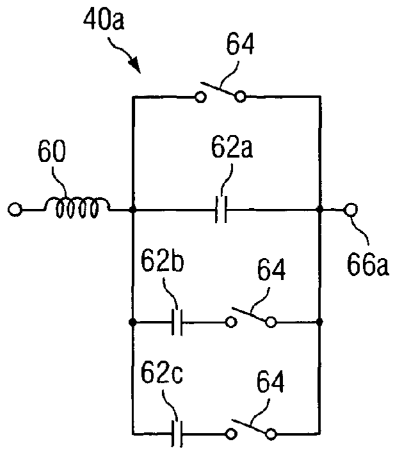
FIGS. 3A-3C illustrate embodiments of stages of the filter depicted in FIG. 1.
Figure 3B:
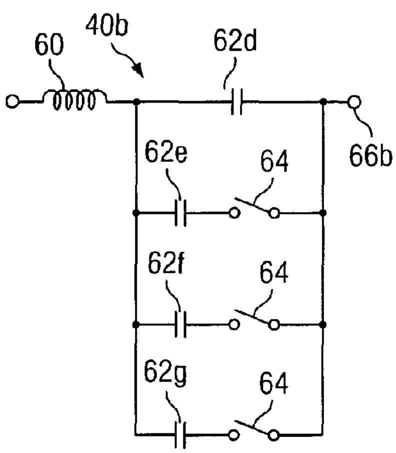
Figure 3C:
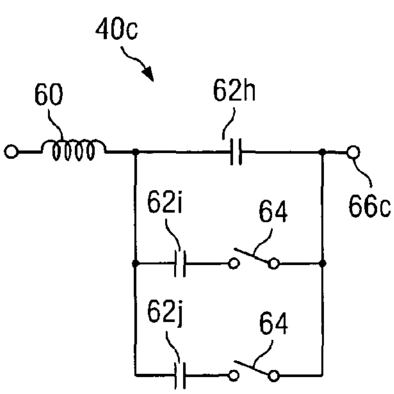

FIGS. 3A-3C illustrate particular embodiments of stages 40*a*-40*c*. Referring to FIG. 3A, stage 40*a* comprises an inductor 60 coupled to the emitter of transistor 42*a* and to a first capacitor 62*a* in series. A second capacitor 62*b* is switchably coupled in parallel to first capacitor 62*a*. A third capacitor 62*c* is switchably coupled in parallel to first capacitor 62*a*. Therefore, signals associated with capacitors 62*b* and 62*c* are switchably coupled to a signal associated with capacitor 62*a*. Capacitors 62*a*, 62*b*, and 62*c* may be referred to collectively as capacitors 62 and generally as a capacitor 62. Capacitors 62 each have a first terminal coupled to a terminal of inductor 60. First capacitor 62*a* has second terminal coupled to a terminal 66*a*. Terminal 66*a* is further coupled to ground. A first switch 64 shorts inductor 60 to terminal 66*a*. A second switch 64 couples the second terminal of second capacitor 62*b* to the second terminal of first capacitor 62*a*. A third switch 64 couples the second terminal of third capacitor 62*c* to the second terminal of first capacitor 62*a*. Switches 64 are selectively enabled based upon command signal 56 generated by controller 46.

Referring to FIG. 3B, stage 40*b* comprises an inductor 60 coupled to the emitter of transistor 42*b* and to a first capacitor 62*d* in series. A second capacitor 62*e* is switchably coupled in parallel to first capacitor 62*d*. A third capacitor 62*f* is switchably coupled in parallel to first capacitor 62*d*. A fourth capacitor 62*g* is switchably coupled in parallel to first capacitor 62*d*. Therefore, signals associated with capacitors 62*e*, 62*f*, and 62*g* are switchably coupled to a signal associated with capacitor 62*d*. Capacitors 62*d*, 62*e*, 62*f*, and 62*g* may be referred to collectively as capacitors 62 and generally as a capacitor 62. Capacitors 62 each have a first terminal coupled to a terminal of inductor 60. First capacitor 62*d* has a second terminal coupled to terminal 66*b*. Terminal 66*b* is further coupled to ground. A first switch 64 couples the second terminal of second capacitor 62*e* to the second terminal of first capacitor 62*d*. A second switch 64 couples the second terminal of third capacitor 62*f* to the second terminal of first capacitor 62*d*. A third switch 64 couples the second terminal of fourth capacitor 62*g* to the second terminal of first capacitor 62*d*. Switches 64 are selectively enabled based upon command signal 56 generated by controller 46.

Referring to FIG. 3C, stage 40*c* comprises an inductor 60 coupled to the emitter of transistor 42*c* and to a first capacitor 62*h* in series. A second capacitor 62*i* is switchably coupled in parallel to first capacitor 62*h*. A third capacitor 62*j* is switchably coupled in parallel to first capacitor 62*h*. Therefore, signals associated with capacitors 62*i* and 62*j* are switchably coupled to a signal associated with capacitor 62*h*. Capacitors 62*h*, 62*i*, and 62*j* may be referred to collectively as capacitors 62 and generally as a capacitor 62. Capacitors 62 each have a first terminal coupled to a terminal of inductor 60. First capacitor 62*h* has a second terminal coupled to terminal 66*c*. Terminal 66*c* is further coupled to ground. A first switch 64 couples the second terminal of second capacitor 62*i* to the second terminal of first capacitor 62*h*. A second switch 64 couples the second terminal of third capacitor 62*j* to the second terminal of first capacitor 62*h*. Switches 64 are selectively enabled based upon command signal 56 generated by controller 46.

The components of stages 40*a*-*c* of filter 12 are formed on integrated circuit 16. The values of capacitors 62 may be selected within a particular stage 40 and among stages 40 such that the appropriate combinations of capacitors 62 coupled in series with inductor 60 provide bandpass filtering about appropriate center frequencies. Although FIGS. 3A-3B illustrate stages 40*a*-*c* having particular numbers and arrangements of capacitors 62, it should be understood that a stage 40 may have any suitable number and arrangement of capacitors 62 to derive a desired level of granularity associated with the ranges of frequency selection.

FIG. 4 illustrates one embodiment of table 70 that stores mapping information 54. Table 70 includes columns 72, 74*a*-*c*, 76*a*-*d*, and 78*a*-*c*. Column 72 identifies the center frequency of a particular band of channels 30. Columns 74*a*-*c*, 76*a*-*d*, and 78*a*-*c* identify which capacitors 62 of stages 40 are enabled in order to yield a frequency response for filter 12 having the center frequency identified in column 72. Example values of capacitors 62*a*-62*j* are provided herein:

Capacitor 62*a*=9.5 pF
Capacitor 62*b*=10.4 pF
Capacitor 62*c*=35.5 pF
Capacitor 62*d*=1.99 pF
Capacitor 62*e*=0.98 pF Capacitor 62*f*=1.41 pF
Capacitor 62*g*=2.1 pF
Capacitor 62*h*=1.035 pF
Capacitor 62*i*=0.366 pF
Capacitor 62*j*=0.497 pF These values are examples only and other suitable values for capacitors 62*a-j* may be used as needed or desired for particular implementations.

For example, with capacitors 62*a-c* shorted in stage 40*a*, filter 12 may communicate intermediate output signal 22 having a band of channels 30 associated with a center frequency of 0 MHz, as indicated by row 80. With capacitor 62*a* of stage 40*a* coupled in series with inductor 60, filter 12 may communicate intermediate output signal 22 having a band of channels 30 associated with a center frequency of 136 MHz, as indicated by row 82. With a parallel combination of capacitors 62*a* and 62*b* of stage 40*a* coupled in series with inductor 60, filter 12 may communicate intermediate output signal 22 having a band of channels 30 associated with a center frequency of 221 MHz, as indicated by row 84. With a parallel combination of capacitors 62*a*, 62*b*, and 62*c* of stage 40*a* coupled in series with inductor 60, filter 12 may communicate intermediate output signal 22 having a band of channels 30 associated with a center frequency of 306 MHz, as indicated by row 86.

With capacitor 62*d* of stage 40*b* coupled in series with inductor 60, filter 12 may communicate intermediate output signal 22 having a band of channels 30 associated with a center frequency of 392 MHz, as indicated by row 88. With a parallel combination of capacitors 62*d* and 62*e* of stage 40*b* coupled in series with inductor 60, filter 12 may communicate intermediate output signal 22 having a band of channels 30 associated with a center frequency of 460 MHz, as indicated by row 90. With a parallel combination of capacitors 62*d*, 62*e*, and 62*f* of stage 40*b* coupled in series with inductor 60, filter 12 may communicate intermediate output signal 22 having a band of channels 30 associated with a center frequency of 542 MHz, as indicated by row 92. With a parallel combination of capacitors 62*d*, 62*e*, 62*f*, and 62*g* of stage 40*b* coupled in series with inductor 60, filter 12 may communicate intermediate output signal 22 having a band of channels 30 associated with a center frequency of 620 MHz, as indicated by row 94.

With capacitor 62*h* of stage 40*c* coupled in series with inductor 60, filter 12 may communicate intermediate output signal 22 having a band of channels 30 associated with a center frequency of 696 MHz, as indicated by row 96. With a parallel combination of capacitors 62*h* and 62*i* of stage 40*c* coupled in series with inductor 60, filter 12 may communicate intermediate output signal 22 having a band of channels 30 associated with a center frequency of 772 MHz, as indicated by row 98. With a parallel combination of capacitors 62*h*, 62*i*, and 62*j* of stage 40*c* coupled in series with inductor 60, filter 12 may communicate intermediate output signal 22 having a band of channels 30 associated with a center frequency of 848 MHz, as indicated by row 100.

Figure 5:
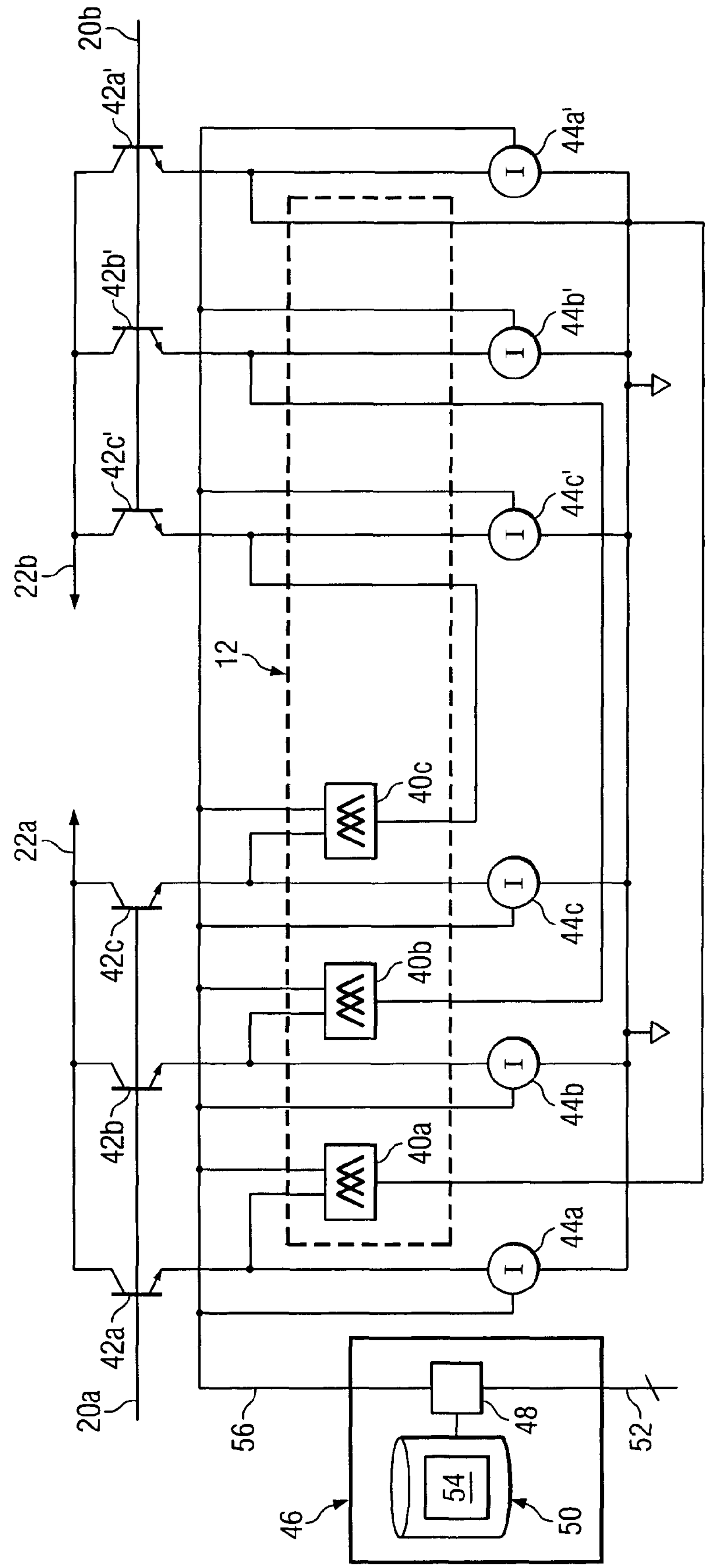
FIG. 5 illustrates a differential embodiment of the filter depicted in FIG. 1.

FIG. 5 illustrates a differential embodiment of circuit 10 in which filter 12 is integrated with an input stage of tuner 14 on integrated circuit 16. In this embodiment, each stage 40 is coupled to an appropriate transistor 42 and input source 44 as well as coupled to a mirror transistor 42' and mirror input source 44'. For example, stage 40*a* is coupled to transistors 42*a* and 42*a'* and input sources 44*a* and 44*a'*. Stage 40*b* is coupled to transistors 42*b* and 42*b'* and input sources 44*b* and 44*b'*. Stage 40*c* is coupled to transistors 42*c* and 42*c'* and input sources 44*c* and 44*c'*. Moreover, the differential embodiment of circuit 10 receives a differential input signal 20 comprising input signal components 20*a* and 20*b*, and generates a differential intermediate output signal 22 comprising intermediate output signal components 22*a* and 22*b*.

Figure 6A:
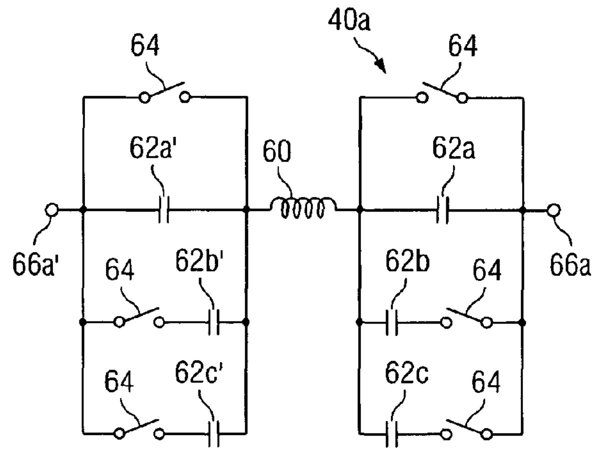
FIGS. 6A-6C illustrate differential embodiments of stages of the filter depicted in FIG. 5.
Figure 6B:
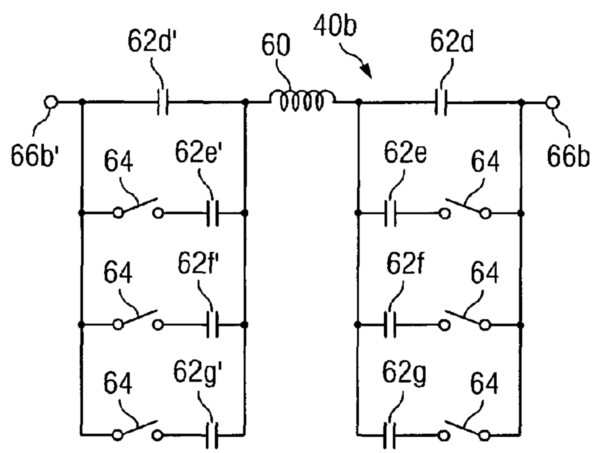
Figure 6C:
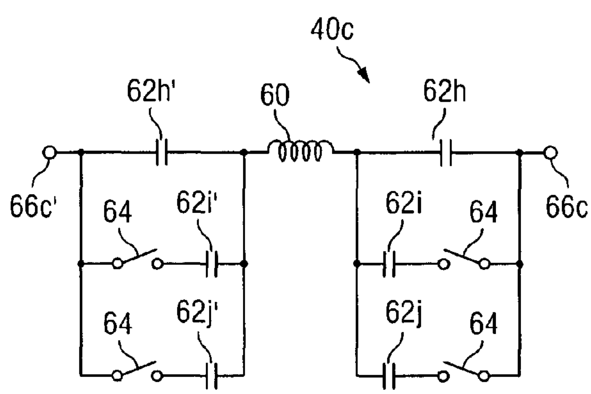

FIGS. 6A-6C illustrate differential embodiments of stages 40*a*-40*c* of FIG. 5. Referring to FIG. 6A, stage 40*a* comprises inductor 60 coupled to capacitors 62*a* and 62*a'* in series. Capacitor 62*a* is further coupled to terminal 66*a* and capacitor 62*a'* is further coupled to terminal 66*b*. Capacitors 62*b* and 62*c* are switchably coupled in parallel to capacitor 62*a*. Capacitors 62*b'* and 62*c'* are switchably coupled in parallel to capacitor 62*a'*. Terminal 66*a* is coupled to the emitter of transistor 42*a'*. Terminal 66*b* is coupled to the emitter of transistor 42*a*. Switches 64 are selectively enabled based upon command signal 56 generated by controller 46.

Referring to FIG. 6B, stage 40*b* comprises an inductor 60 coupled to capacitors 62*d* and 62*d'*. Capacitors 62*e*, 62*f*, and 62*g* are switchably coupled in parallel to capacitor 62*d*. Capacitors 62*e'*, 62*f'*, and 62*g'* are switchably coupled in parallel to capacitor 62*d'*. Capacitor 62*d* is further coupled to terminal 66*b* which is coupled to the emitter of transistor 42*b'*. Capacitor 62*d'* is further coupled to terminal 66*b'* which is coupled to the emitter of transistor 42*b*. Switches 64 are selectively enabled based upon command signal 56 generated by controller 46.

Referring to FIG. 6C, stage 40*c* comprises an inductor 60 coupled to capacitors 62*h* and 62*h'*. Capacitors 62*i* and 62*j* are switchably coupled in parallel to capacitor 62*h*. Capacitors 62*i'* and 62*j'* are switchably coupled in parallel to capacitor 62*h'*. Capacitor 62*h* is further coupled to terminal 66*c* which is coupled to the emitter of transistor 42*c'*. Capacitor 62*h'* is further coupled to terminal 66*c'* which is coupled to the emitter of transistor 42*c*. Switches 64 are selectively enabled based upon command signal 56 generated by controller 46.

In general, the values of capacitors 62*a'*-62*j'* are the same as the values of the appropriate corresponding capacitors 62*a*-62*j*.

Although the present invention has been described in detail, it should be understood that various changes, substitutions and alterations can be made hereto without departing from the sphere and scope of the invention as defined by the appended claims.

To aid the Patent Office, and any readers of any patent issued on this application in interpreting the claims appended hereto, applicants wish to note that they do not intend any of the appended claims to invoke ¶ 6 of 35 U.S.C. §112 as it exists on the date of filing hereof unless "means for" or "step for" are used in the particular claim.

What is claimed is:

1. A system, comprising:

a filter operable to receive an input signal comprising a first number of television channels and further operable to communicate an intermediate output signal comprising a second number of television channels less than the first number of television channels, wherein at least a portion of the filter is formed on an integrated circuit so as to dissipate a plurality of undesired channels associated with the input signal in elements of the integrated circuit such that at least a portion of the undesired signals are not reflected back to a transmitter of the input signal; and a tuner coupled to the filter and operable to receive the intermediate output signal and further operable to communicate an output signal comprising a third number of television channels less than the second number of television channels, wherein at least a portion of the tuner is formed on the integrated circuit.

2. The system of claim 1, wherein:

the first number of television channels is greater than one-hundred;

the second number of television channels is less than forty; and the third number of television channels is less than three.

3. The system of claim 1, wherein:

the first number of television channels comprises a plurality of bands of channels; and the filter comprises a plurality of stages and is switchable among the plurality of stages to communicate the intermediate output signal comprising a selected one of the plurality of bands of channels.

4. The system of claim 1 wherein:

the first number of television channels comprises a plurality of bands of channels; and the filter comprises a plurality of stages, wherein at least one stage is switchable among a plurality of capacitors to communicate the intermediate output signal comprising a selected one of the plurality of bands of channels.

5. The system of claim 1, wherein the filter comprises at least one stage comprising:

an inductor;

a first capacitor having a first lead and a second lead, wherein the first lead of the first capacitor is coupled to a lead of the inductor; and a plurality of capacitors, each of the capacitors having a first lead coupled to the first lead of the first capacitor and a second lead switchably coupled to the second lead of the first capacitor.

6. The system of claim 5, further comprising a controller coupled to the filter and operable to enable a selected one of the plurality of stages of the filter and further operable to enable selected ones of the capacitors associated with the selected stage.

7. The system of claim 1, wherein the input signal comprises a radio frequency signal ranging from 48 MHz to 852 MHz.

8. The system of claim 1, wherein the filter comprises an input stage of the tuner.

9. The system of claim 1, wherein the filter comprises a first filter and further comprising a second filter operable to communicate the input signal to the first filter, the second filter comprising a low-pass filter having an input cutoff frequency higher than 806 MHz.

10. The system of claim 1, wherein:

the input signal comprises a differential signal; and the intermediate output signal comprises a differential signal.

11. A system, comprising first means for receiving an input signal comprising a first number of television channels and for communicating an intermediate output signal comprising a second number of television channels less than the first number of television channels, wherein at least a portion of the first means is formed on an integrated circuit so as to dissipate a plurality of undesired channels associated with the input signal in elements of the integrated circuit such that at least a portion of the undesired signals are not reflected back to a transmitter of the input signal; and second means for receiving the intermediate output signal and for communicating an output signal comprising a third number of television channels less than the second number of television channels, wherein at least a portion of the second means is formed on the integrated circuit.

12. The system of claim 11, wherein the input signal comprises a radio frequency signal ranging from 48 MHz to 852 MHz.

* * * * *